United States Patent [19]

Kurosawa

[11] Patent Number: 5,663,662
[45] Date of Patent: Sep. 2, 1997

[54] LIBRARY GROUP AND SEMICONDUCTOR INTEGRATED CIRCUIT STRUCTURED THEREOF

[75] Inventor: Susumu Kurosawa, Tokyo, Japan

[73] Assignee: NEC Corporation, Tokyo, Japan

[21] Appl. No.: 574,378

[22] Filed: Dec. 18, 1995

[30] Foreign Application Priority Data

Dec. 27, 1994 [JP] Japan ................................. 6-324893

[51] Int. Cl.⁶ ......................................... H03K 19/177
[52] U.S. Cl. ...................... 326/41; 326/47; 257/208; 364/491
[58] Field of Search ........................ 326/41, 47, 101; 257/202, 208; 364/490–491

[56] References Cited

U.S. PATENT DOCUMENTS

| | | | |
|---|---|---|---|
| 4,611,236 | 9/1986 | Sato | 357/45 |
| 4,651,109 | 3/1987 | Suzuki et al. | 357/45 |
| 4,945,395 | 7/1990 | Suehiro | 357/40 |
| 5,289,021 | 2/1994 | El Gamal | 257/206 |
| 5,598,347 | 1/1997 | Iwasaki | 364/491 |

FOREIGN PATENT DOCUMENTS

| | | |
|---|---|---|
| 63-43345 | 2/1988 | Japan. |
| 63-46748 | 2/1988 | Japan. |

OTHER PUBLICATIONS

"Bipolar–FET Hybrid–Mode Operation of Quarter–Micrometer SOI MOSFET's" by Parke, et al., IEEE Electron Device Letters, vol. 14, No. 5, May 1993, pp. 234–236.

"An SOI Voltage–Controlled Bipolar–MOS Device" by Colinge, IEEE Transactions on Electron Devices, vol. ED–34, No. 4, Apr. 1987, pp. 845–849.

"A High–Performance Lateral Bipolar Transistor Fabricated on SIMOX" by Parke, et al., IEEE Electron Device Letters, vol. 14, No. 1, Jan. 1993, pp. 33–35.

*Primary Examiner*—David R. Hudspeth
*Attorney, Agent, or Firm*—Laff, Whitesel, Conte & Saret, Ltd.

[57] ABSTRACT

A library group structured of logic gates and function blocks which allow all of the requirements of high speed operation, low power consumption, and high integration to be satisfied and a load driving capability to be optimally selected without need to rework and modify the placement and wiring design work is provided. A library group is structured of basic cells of transistors with a small channel width and has plural logic gates and plural function blocks which have the same logic function, the same size, and the same input/output terminal positions and which have different load driving capability. A portion which performs a logical function is separated from a portion which performs a load driving function. The portion which performs the load driving function is structured of a lateral type bipolar device or a hybrid mode device corresponding to SOI technology.

23 Claims, 9 Drawing Sheets

P CHANNEL TYPE BASIC TRANSISTOR

N CHANNEL TYPE BASIC TRANSISTOR

3-INPUT NAND GATE

BUFFER CIRCUIT

INVERTER CIRCUIT

F I G. 4(a)
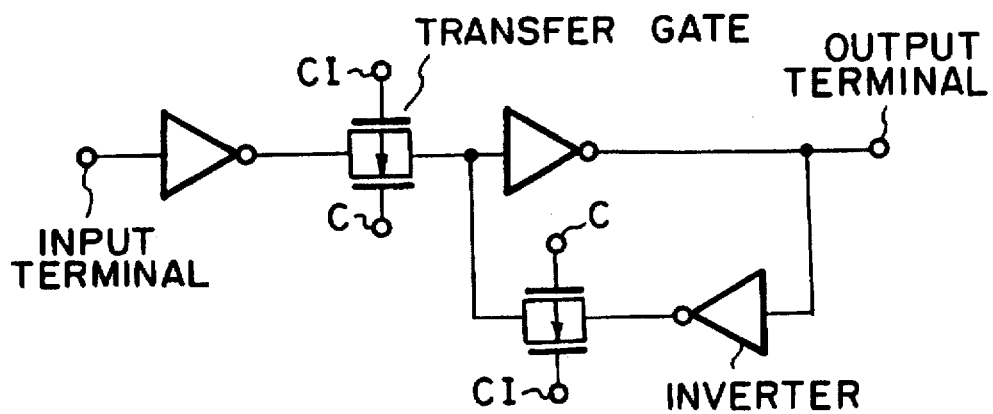
F I G. 4(b)
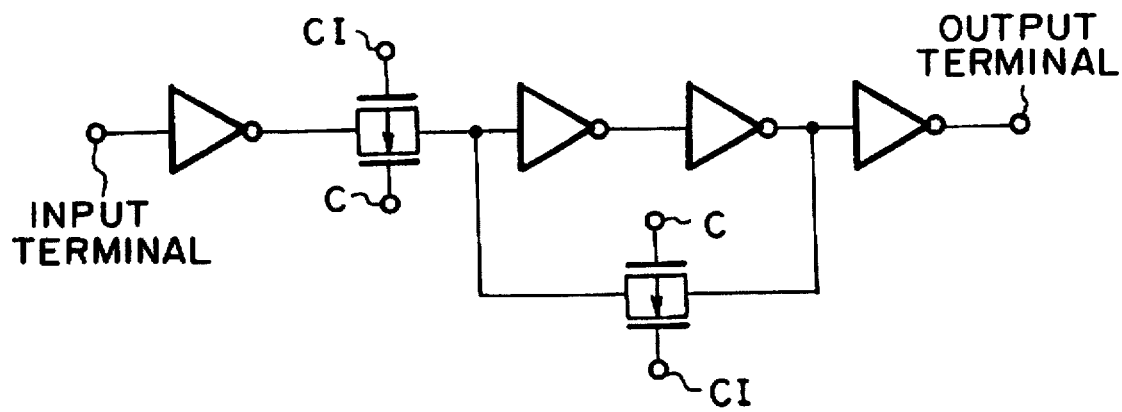
F I G. 4(c)
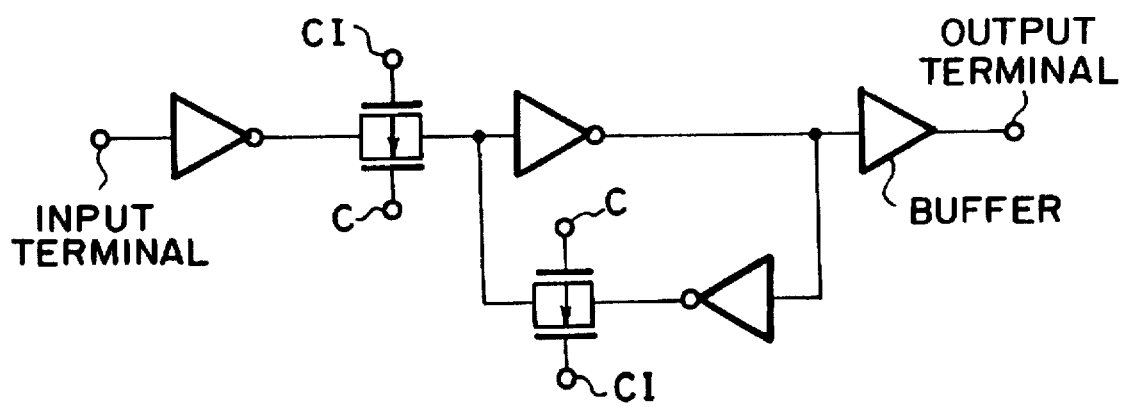

P CHANNEL TYPE BASIC TRANSISTOR

N CHANNEL TYPE BASIC TRANSISTOR

F I G. 10
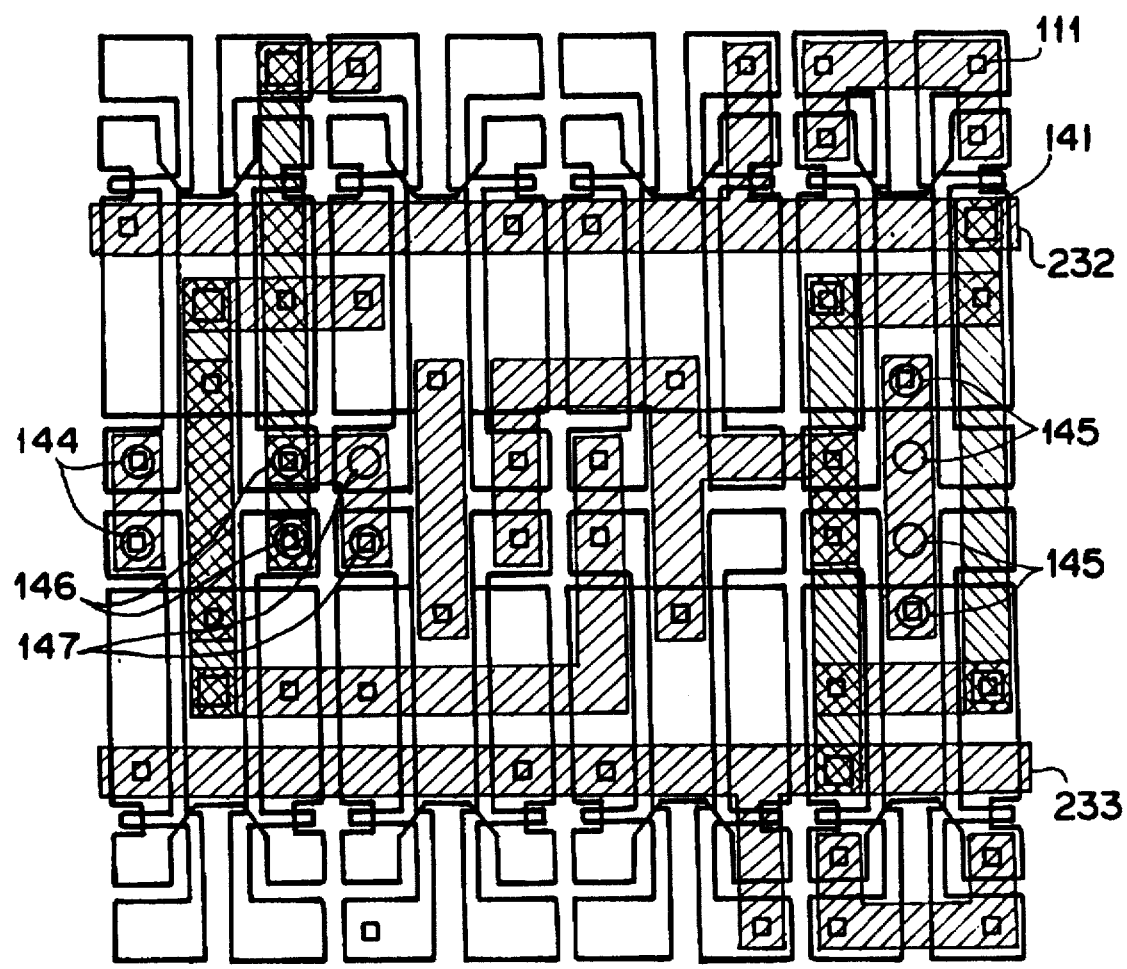

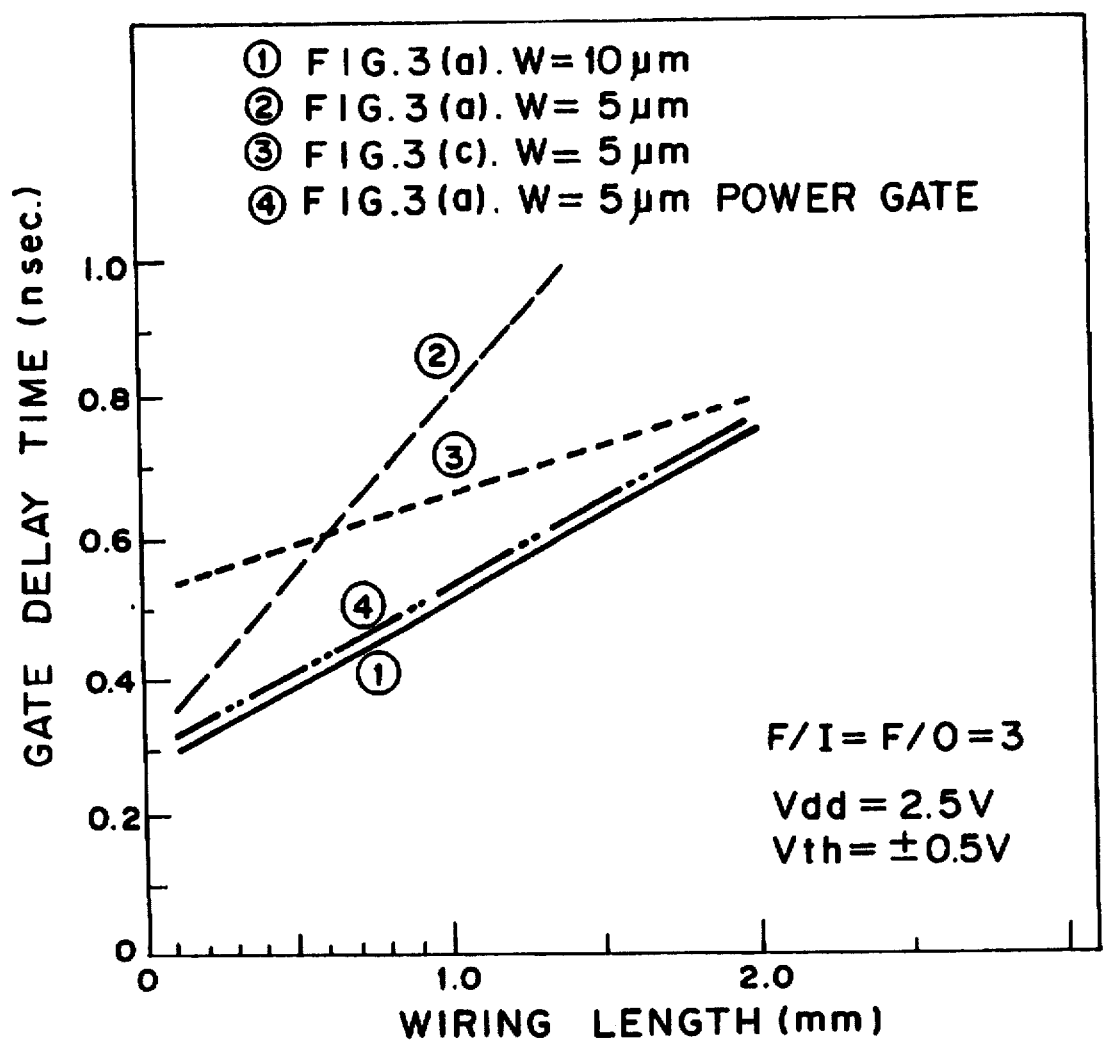

LIBRARY GROUP AND SEMICONDUCTOR INTEGRATED CIRCUIT STRUCTURED THEREOF

BACKGROUND OF THE INVENTION

1. Field of the Invention

The present invention relates to a library group structured of logic gates and function blocks and a semiconductor integrated circuit structured of the library group. In particular, the present invention relates to a library group structured of logic gates and function blocks that satisfy both requirements of high speed operation and low power consumption and a semiconductor integrated circuit structured of the library group.

2. Description of the Related Art

A logic circuit for use in combination with a semiconductor integrated circuit (hereinafter referred to as an LSI; a large scale integrated circuit) is structured of logic gates (such as inverter, NAND gates, and OR gates) and/or function blocks (such as flip-flop circuits structured of several gates to several dozens of gates) which themselves have logically coherence. These logic gates and/or function blocks are designed before an LSI is individually designed. The designed logic blocks and function blocks are provided as a library group of a database. Thus, to design a logic LSI, logic gates and function blocks provided as a library group are placed on a chip and mutually connected.

Usually, a logic circuit of an LSI is formed on an array of basic transistors that have the same size. Examples of arrays are gate arrays and embedded arrays. For example, in a CMOS LSI, a basic cell is structured by plural P channel type basic transistors and plural N channel type basic transistors. The basic cells are generally arranged in an array shape.

The logic gates and function blocks should have a load capacitance driving capability along with a logic function. The load capacitance is composed of a next stage input capacitance and a wiring capacitance. The load capacitance is quantitatively defined with the number of gates connected to output (referred to as the number of fan-outs) and the wiring length between the output and the next stage. The number of fan-outs and the wiring length largely depend on each gate and each block. If we try to design a load capacitance driving capability individually and optimally, a precise wiring capacitance and a very long designing time may be required. However, a precise wiring capacitance may not be obtained until the layout design has been completed. Therefore, it is not realistic that the load capacitance driving capability is individually and optimally designed.

To solve this problem, assuming a standard logic gate and a standard load condition, the size of a basic transistor with a desired delay time is predetermined. As a standard logic gate, a three-input NAND gate is considered. In addition, as a standard load condition, the number of fan-outs is three and the wiring length is about 2 mm is normally considered. Thus, in a CMOS LSI, the channel width of a basic transistor is designated 10 to 20 μm.

For a load larger than the standard load condition, a logic gate with a large load driving capability or a special driver circuit is provided. For example, for a simple logic gate or the like, a structure of which plural same gates are connected in parallel is conventionally provided. This structure is referred to as a power gate.

In a library group structured of such logic gates and function blocks and an LSI structured of the library group, speed and power consumption performance are not optimized. In other words, it is difficult to satisfy both the requirements of high speed and low power consumption.

In the case of, for example, a CMOS circuit, the load driving capability depends on the logic structure and the ratio between the channel width and the channel length of a MOSFET. For example, in the case of a three-input NAND gate, three N channel MOSFETs are connected in series. In the discharge state, the load driving capability of the three-input NAND gate is decreased to one third of that of an inverter gate. To drive the standard load at a high speed in such a situation, the channel width of a basic transistor is designed as large as 10 to 20 μm. However, when the wiring length is short and the load of the fan-outs is dominant, the delay time does not depend on the channel width of the MOSFET, and the power is wasteful corresponding to the size of the basic transistor. In conventional logic circuits, half of logic gates and function blocks represent such a tendency. In particular, most of them in the data-pass portion almost represent such a tendency.

On the other hand, when the size of the basic transistors is simply reduced, although such a loss of the power can be reduced, if the fan-out load is not dominant, the operation speed deteriorates. In the case of a power gate, which is used to improve the load driving capability, since the area becomes twice or more, when the logic function becomes complicated, the areal efficiency remarkably deteriorates.

To solve such a problem, a structure that independently provides a portion that performs a logic function and a portion that performs a load driving function has been proposed in Japanese Patent Laid-Open Publication No. 63-43345 (this is referred to as the related art reference 1). For example, as shown in FIGS. 12(a) and 12(b), a two-input AND gate is divided into a two-input NAND gate and an inverter circuit. The former has a logic function, while the latter has a load driving function. They are applied for a standard cell as shown in FIG. 12(c). After the layout design has been completed, the size of an output transistor that structures the inverter circuit is optimally designated corresponding to the load. When this method is applied for a gate array or an embedded array, if necessary, plural transistors are connected in parallel so that the size of an output transistor that structures an inverter circuit is optimally designated corresponding to the load.

A structure of which at least an output block is connected in parallel so that a predetermined fan-out characteristic can be obtained has been proposed in Japanese Patent Laid-Open Publication No. 63-46748 (this is referred to as the related art reference 2). For example, as shown in FIG. 13, in a logic circuit structured of three two-input NAND gates, a NAND gate at the last stage is connected in parallel corresponding to the load.

In the related art reference 1, the portion that performs the logic function can be structured of small transistors. In the related art reference 2, the portion of function blocks other than an output block can be structured of small transistors. Thus, the power consumption can be reduced without a decrease of the operation speed.

However, in the conventional library group structured of logic gates and function blocks and an LSI structured of the library group, when a gate array and an embedded array structured of basic transistors that have the same size are especially used, the designing time and areal efficiency are very wasteful.

Unless the layout design of an LSI has been completed, the load thereof cannot be precisely obtained. Thus, there may be a large difference between the load that has been initially estimated and the real load of the LSI. When the real load is greater than the initially estimated load, the load driving capability should be increased so as to prevent the operating speed from decreasing. On the other hand, when the real load is smaller than the initially estimated load, the load driving capability should be decreased so as to reduce the power consumption. In other words, after the placement and wiring have been designed, the load should be precisely estimated corresponding to the real designed result. When the real load is larger than the initially estimated load, the load driving capability should be increased so as to prevent the operating speed from decreasing. When the real load is smaller than the initially estimated load, the load driving capability should be decreased so as to reduce the power consumption without a sacrifice of the operating speed.

To do that, a library group structured of plural logic gates and function blocks that have the same logic function and that have different load driving capability should be provided so that proper logic gates and proper function blocks can be replaced. However, since the sizes and input/output terminal positions of the conventional library group differ from each other, the placement and wiring design should be performed again from the beginning. Thus, a very long designing time is required. In occasion, a rework may result in another rework, and after redesign of the placement and wiring design, may be performed for other positions. In addition, this rework does not guaranteed that the design is completed.

An increase of the load driving capability in the related art reference 3 is equivalent to the case that an output block is structured of a power gate. Thus, when the logic function of the output block is complicated, the areal efficiency remarkably deteriorates.

SUMMARY OF THE INVENTION

An object of the present invention is to provide a library group structured of logic gates and function blocks that allow all of the requirements of high speed operation, low power consumption, and high integration to be satisfied and a load driving capability to be optimally selected without need to rework and modify the placement and wiring design work.

The present invention is a library group structured of basic cells and having logic gates that have the same logic function, the same size, and the same input/output terminal positions and that have different load driving capability.

The present invention is a library group structured of basic cells and having function blocks that have the same logic function, the same size, and the same input/output terminal positions and that have different load driving capability.

The present invention is a library group structured of basic cells and having logic gates and function blocks that have the same logic function, the same size, and the same input/output terminal positions and that have different load driving capability.

In addition, the present invention is a logic circuit structured of the library group with the above-described features, and a semiconductor integrated circuit structured of the library group thereof.

These and other objects, features and advantages of the present invention will become more apparent in light of the following detailed description of best mode embodiments thereof, as illustrated in the accompanying drawings.

BRIEF DESCRIPTION OF DRAWINGS

FIGS. 4(a) to 4(c) are second circuit diagrams for explaining the first embodiment of the present invention;

FIG. 10 is a layout diagram for explaining the second embodiment of the present invention;

FIG. 11 is a graph showing characteristics of a library group according to the present invention;

DESCRIPTION OF PREFERRED EMBODIMENTS

Embodiments of the present invention will be described with reference to the accompanying drawings.

Figure 1A:
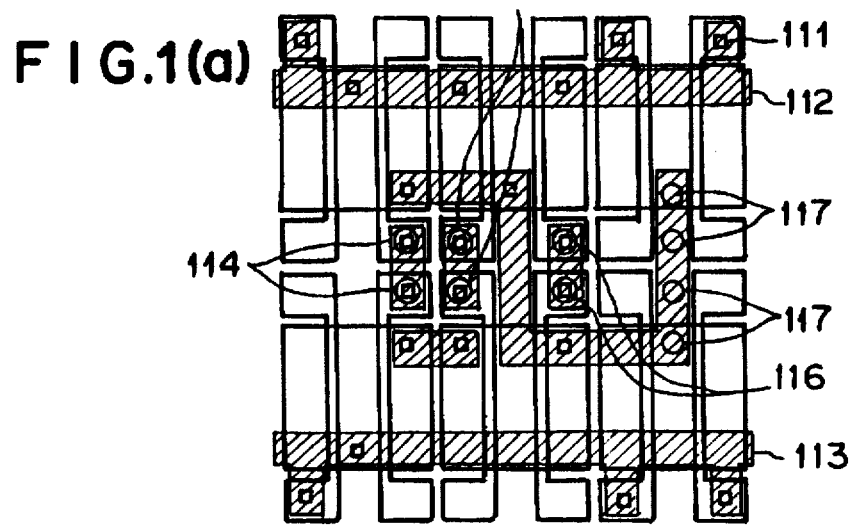
FIGS. 1(a) to 1(c) are layout diagrams for explaining a first embodiment of the present invention.
Figure 1B:
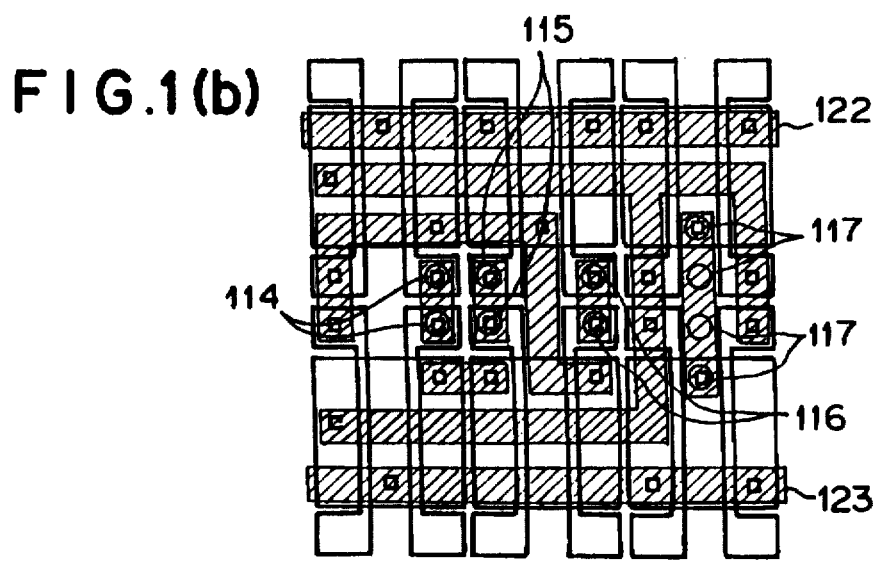
Figure 1C:
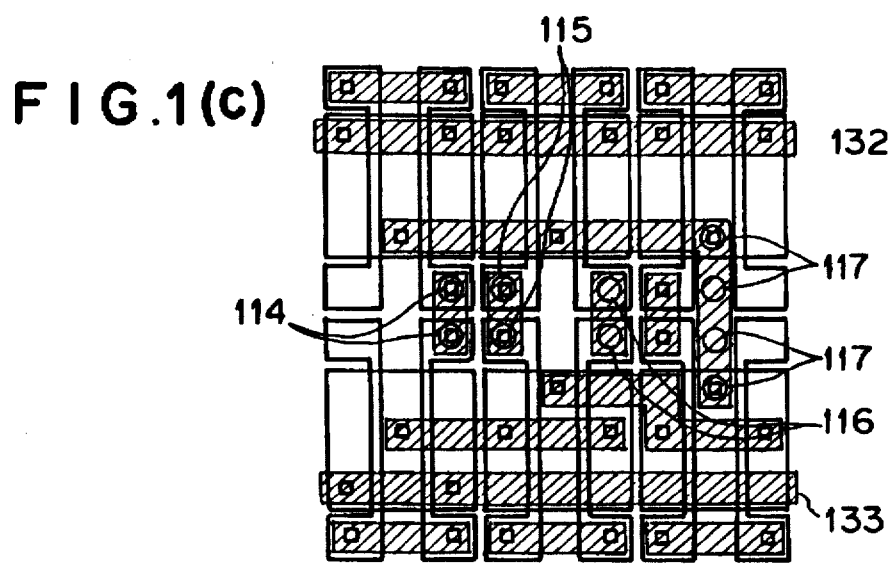
Figure 2:
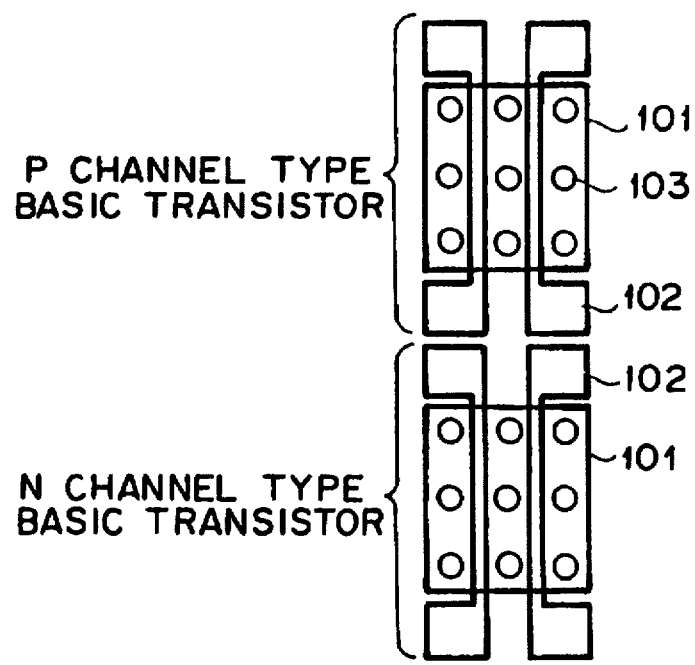
FIG. 2 is a layout diagram for explaining a basic cell.
Figure 3A:
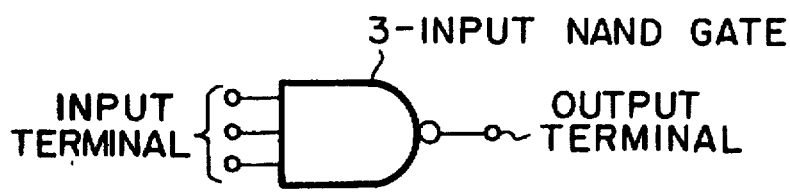
FIGS. 3(a) to 3(c) are circuit diagrams for explaining the first embodiment of the present invention.
Figure 3B:
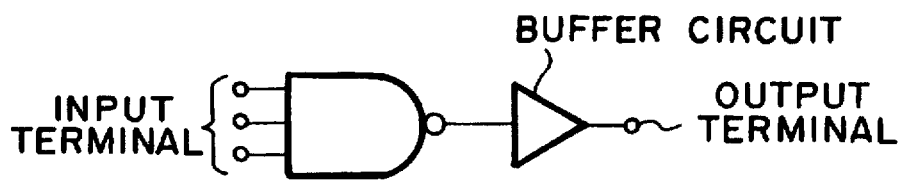
Figure 3C:
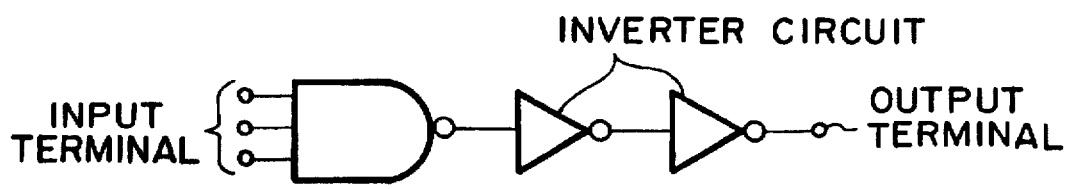

FIGS. 1(a), 1(b), and 1(c) are layout diagrams for explaining a first embodiment of the present invention. With three basic cells shown in FIG. 2, circuits shown in FIGS. 3(a), 3(b), and 3(c) are formed as libraries. FIGS. 3(a) to 3(c) are circuit diagrams for explaining the first embodiment of the present invention. A three-input NAND gate is shown in FIG. 3(a). In FIG. 3(b), to separate a portion that performs a logic function and a portion that performs a load driving function, a buffer circuit is added. In FIG. 3(c), two stages of inverter circuits are used as a buffer circuit.

In FIGS. 1(a), 1(b), and 1(c), finely hatched patterns represent metal wires on a first layer. Small squares 111 represent contacts. In FIG. 2, circles 103 represent contact positions in source and drain diffusion layer regions. In this example, the number of contact positions is three. The basic cell is constructed by two P channel type basic transistors and two N channel type basic transistors. Reference numeral 101 is a field pattern. Reference numeral 102 is a gate electrode pattern.

FIG. 1(a) is a layout diagram of which the circuit shown in FIG. 3(a) is formed as a library. Reference numeral 112 is a power supply line. Reference numeral 113 is a ground line. Reference numerals 114, 115, and 116 are input terminal positions. Reference numeral 117 is an output terminal position. FIG. 1(b) is a layout diagram of which the circuit shown in FIG. 3(c) is formed as a library. In FIG. 1(b), two transistors are connected in parallel so as to improve the load driving capability of an inverter circuit on the last stage. Reference numeral 122 is a power supply line. Reference numeral 123 is a ground line. Reference numerals 114, 115, and 116 are input terminal positions. Reference numeral 117 is an output terminal position. FIG. 1(c) is a layout diagram of which two transistors are connected in parallel in the circuit shown in FIG. 3(a) so as to improve the load driving capability of the three-input NAND gate. This structure is referred to as a power gate. Reference numeral 132 is a power supply line. Reference numeral 133 is a ground line. Reference numerals 114, 115, and 116 are input terminal positions. Reference numeral 117 is an output terminal position.

It is clear that each of the libraries shown in FIGS. 1(a), 1(b), and 1(c) has the same logic function, the same size, and the same input/output terminal positions and different load driving capability. When the libraries shown in FIGS. 1(a), 1(b), and 1(c) are compared, in the library shown in FIG. 1(b), a portion that performs a logic function is separated from a portion that performs a load driving function so as to provide a load driving capability different from the library shown in FIG. 1(a). In the library shown in FIG. 1(c), both the function portions are not separated. In the library shown in FIG. 1(a), since six transistors are not used, a loss takes place. However, the integration of a real logic LSI does not depend on the integration of each of the libraries. To mutually connect these libraries, a very large number of wiring channels are required. Thus, individual libraries are required an allowance to some extent. Consequently, such a loss of each library never results in an increase of the chip area of the resultant logic LSI.

FIGS. 4(a) to 4(c) is a second circuit diagram for explaining the first embodiment of the preset invention. In FIG. 4(a) to 4(c), a method for accomplishing a different load driving capability is shown as an example of a static latch circuit. In FIG. 4(a) to 4(c), C and CI are clock signals supplied to a transfer gate. These clock signals have opposite phases of which these signals do not overlap. FIG. 4(b) shows an example of which one inverter circuit is added and the connections of the circuit shown in FIG. 4(a) are changed. In this case, the load driving capability of the inverter circuit on the last stage can be changed without an influence against the circuit operation. FIG. 4(c) shows the case that a buffer circuit that performs a load driving function is added.

Figure 5A:
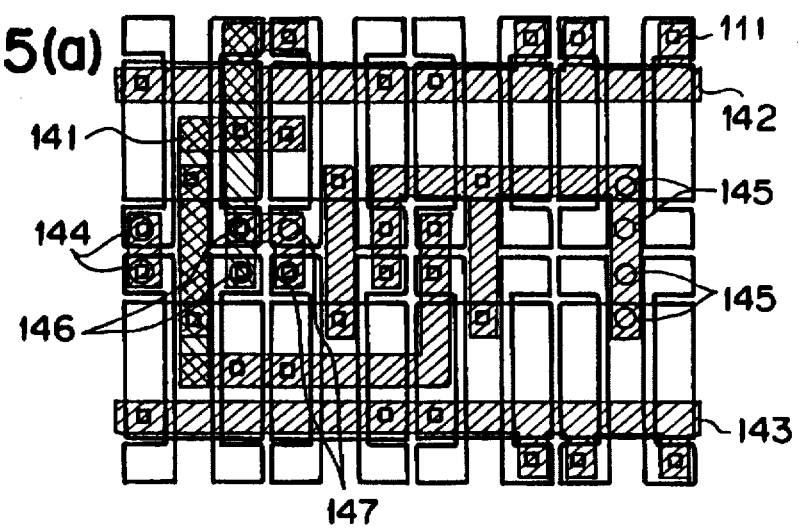
FIGS. 5(a) to 5(c) are second layout diagrams for explaining the first embodiment of the present invention.
Figure 5B:
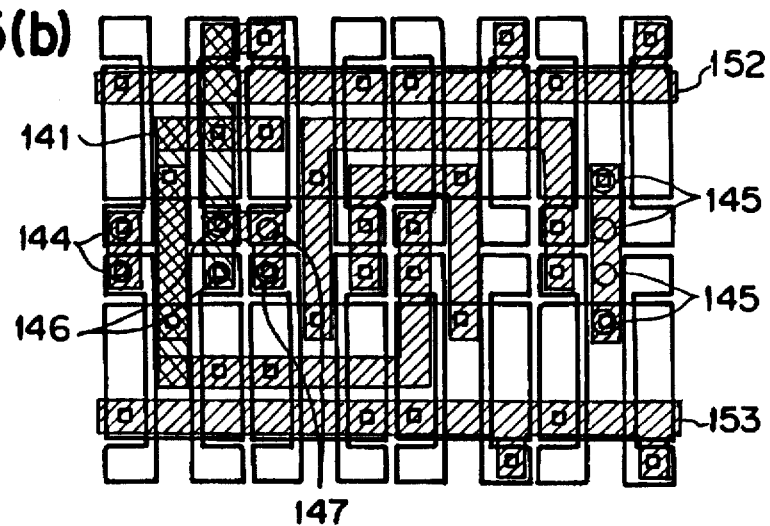
Figure 5C:
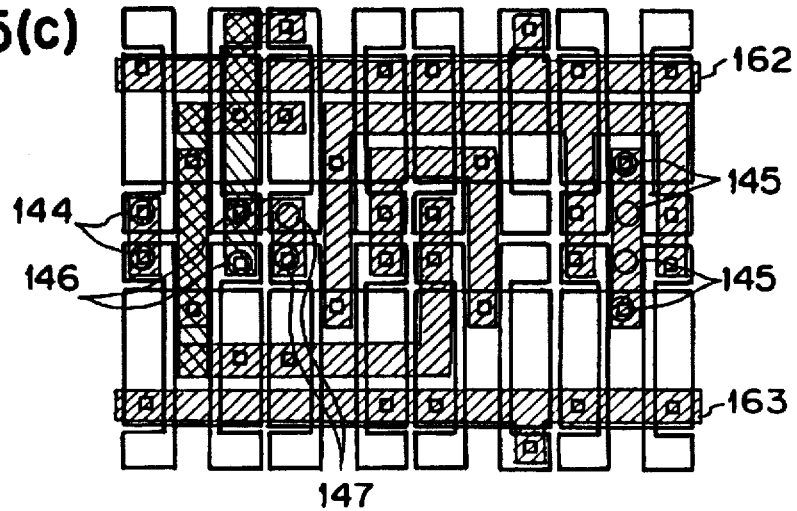

FIGS. 5(a) to 5(c) show examples of layouts of which circuits shown in FIGS. 4(a) to 4(c) are formed as libraries with four basic cells shown in FIG. 2. In these examples of the layouts, finely hatched patterns represent metal wires on the first layer. Coarsely hatched patterns represent metal wires on the second layer. Small squares 111 represent contacts. Large squares 141 represent through-holes that connect the metal wires on the first layer and the metal wires on the second layer. FIG. 5(a) is a layout diagram of which the circuit shown in FIG. 4(a) is formed as a library. Reference numeral 142 is a power supply line. Reference numeral 143 is a ground line. Reference numeral 144 is an input terminal position. Reference numeral 145 is an output terminal position. Reference numeral 146 is a C signal input terminal position. Reference numeral 147 is a CI signal input terminal position. FIG. 5(b) is a layout diagram of which the circuit shown in FIG. 4(b) is formed as a library. Reference numeral 152 is a power supply line. Reference numeral 153 is a ground line. Reference numeral 144 is an input terminal position. Reference numeral 145 is an output terminal position. Reference numeral 146 is a C signal input terminal position. Reference numeral 147 is a CI signal input terminal position. FIG. 5(c) is a layout diagram of which the circuit shown in FIG. 4(c) is formed as a library. In FIG. 5(c), two transistors are connected in parallel so as to improve the load driving capability of only the inverter circuit on the last stage. Reference numeral 162 is a power supply line. Reference numeral 163 is a ground line. Reference numeral 144 is an input terminal position. Reference numeral 145 is an output terminal position. Reference numeral 146 is a C signal input terminal position. Reference numeral 147 is a CI signal input terminal position.

Each of the libraries shown in FIG. 5 has the same logic function, the same size, and the same input/output terminal positions and has different load driving capability. When the libraries shown in FIGS. 5(a), 5(b), and 5(c) are compared, in the libraries shown in FIGS. 5(b) and 5(c), a portion that performs a logic function is separated from a portion that performs a load driving function so as to have a different load driving capability.

Figure 6:
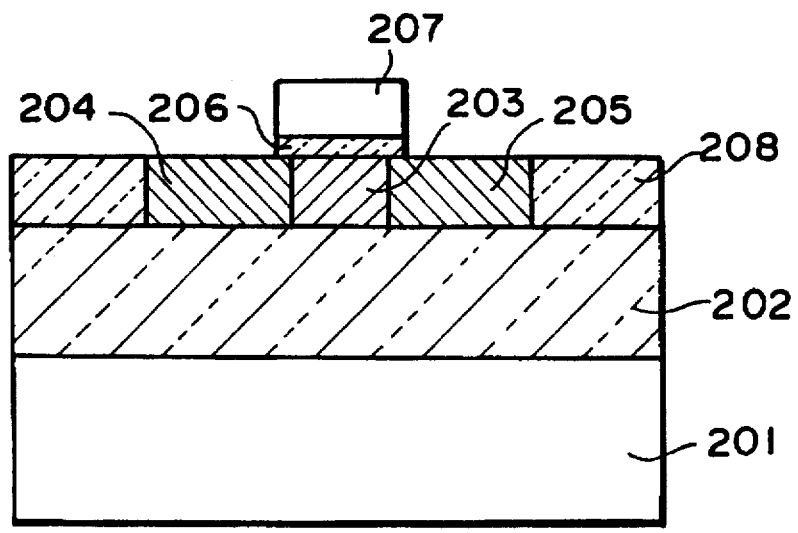
FIG. 6 is a sectional view showing a MOSFET corresponding to an SOI technology.

In recent years, an SOI (silicon on insulator) technology is becoming popular as a device technology having characteristic of high speed operation and the low power consumption. FIG. 6 is a sectional view showing an N channel MOSFET corresponding to the SOI technology. Reference numeral 201 is an Si (silicon) substrate. Reference numeral 202 is an insulation film. Reference numeral 203 is a P type transistor-body region. Reference numeral 204 is an N type source region. Reference numeral 205 is an N type drain region. Reference numeral 206 is a gate oxide film. Reference numeral 207 is a gate electrode. Reference numeral 208 is an insulation film. It is preferable to directly supply a voltage to the transistor-body region 203 from a view point of the stability of the transistor operation. However, when the device is operated at a low power supply voltage, the transistor-body region may be operated in a floating state without need to directly supply a voltage. A structure of which a voltage is directly supplied to the transistor-body region is described in for example "An SOI Voltage-Controlled Bipolar-MOS Device" by JEAN-PIERRE COLINGE, "IEEE ELECTRON DEVICES", FIG. 1, page 845–849, April 1987. Thus, this structure can be accomplished by the known technology.

A lateral type bipolar device using the MOSFET structure is shown in for example "A High-Performance Lateral Bipolar Transistor Fabricated on SIMOX" by Parke et al, "IEEE ELECTRON DEVICE LETTERS", pp. 33–35, January 1993. In this structure, the source is operated as an emitter. The drain is operated as a collector. The transistor-body is operated as a base. In the case of an NPN type device, the gate electrode is connected to the ground voltage. In the case of a PNP type device, the gate electrode is connected to the power supply voltage.

In addition, a hybrid mode device is described in for example "Bipolar-FET Hybrid-Mode Operation of Quarter-Micrometer SOI MOSFET's" by Parke et al, "IEEE ELECTRON DEVICE LETTERS", pp. 234–236, May 1993. The source is operated as an emitter. The drain is operated as a collector. The transistor-body is connected to a gate electrode and operated as a base. In the hybrid mode device, as with the MOSFET, the threshold voltage depends on the distribution of impurities in the channel region and the like. In addition, as with a bipolar device, the hybrid mode device has a sharp subthreshold characteristic. Thus, the hybrid mode device is very attractive at a low power supply voltage.

Figure 7A:
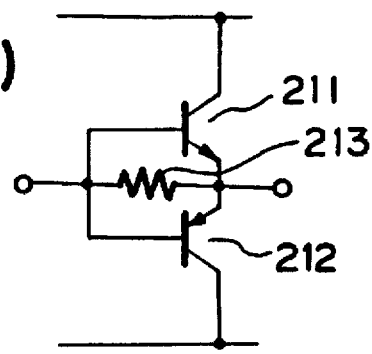
FIGS. 7(a) to 7(b) are circuit diagrams for explaining a second embodiment of the present invention.
Figure 7B:
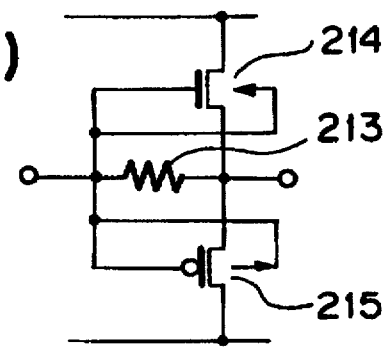

FIGS. 7(a) and 7(b) are circuit diagrams for explaining a second embodiment of the present invention. The circuits shown in FIGS. 7(a) and 7(b) are buffer circuits that are very simply structured and have very high driving capability. FIG. 7(a) shows a buffer circuit using a bipolar device. Reference numeral 211 is an NPN type bipolar device. Reference numeral 212 is a PNP type bipolar device. Reference numeral 213 is a resistor device. When the input signal is the power supply voltage, the resistor device causes the output voltage to be securely charged to the power supply voltage. When the input signal is the ground voltage, the resistor device causes the output voltage to be securely discharged to the ground voltage. Thus, the resistor device is not essential for the circuit operation. FIG. 7(b) shows a circuit using a hybrid mode device. Reference numeral 214 is an N channel type hybrid mode device. Reference numeral 215 is a P channel type hybrid mode device. Reference numeral 213 is a resistor device.

Figure 8:
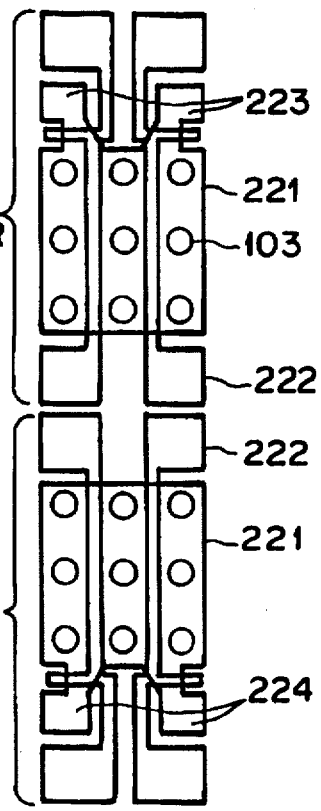
FIG. 8 is a layout diagram for explaining a basic cell according to the second embodiment of the present invention.

FIG. 8 is a layout diagram of a basic cell for explaining the second embodiment of the present invention. In FIG. 8, the basic cell is constructed by two P channel type basic transistors and two N channel type basic transistors. Voltages can be supplied to transistor-body regions of the MOSFETs. Reference numeral 221 is a field pattern. Reference numeral 222 is a gate electrode pattern. Reference numeral 223 is an N type diffusion layer region for supplying a voltage to the transistor-body regions of the P channel type MOSFETs. Reference numeral 224 is a P type diffusion layer region for supplying a voltage to the transistor-body regions of the N channel type MOSFETs. Circles 103 represent contact-possible positions of the source and drain diffusion layer regions. In this example, the number of contact positions is three. When this basic cell is used, the basic transistors can be operated as MOSFETs, lateral type bipolar devices, or hybrid mode devices. The feature of this basic cell is very advantageous, in a gate array or an embedded array of which basic cells are normally arranged in an array shape.

The structure of which the basic cell shown in FIG. 8 is operated as the above-described device will be described. When the regions 223 and 224 are operated in the floating state or predetermined voltages are supplied (for example, the power supply voltage is supplied to the region 223 and the ground voltage is supplied to the region 224), the basic cell is operated as an MOSFET similarly to the basic cell shown in FIG. 2. When predetermined voltages are supplied to the gates of the basic transistors (for example, the power supply voltage is supplied to the gate of the P channel MOSFET and the ground voltage is supplied to the gate of the N channel MOSFET) and the source, the drain, and the regions 223 and 224 are used as an emitter, a collector, and a base, respectively, the basic cell is operated as a lateral type bipolar device. When the regions 223 and 224 are connected to the gate of the basic transistor and used as a base, the source is used as an emitter, and the drain is used as a collector, the basic cell can be operated as a hybrid mode device.

Figure 9:
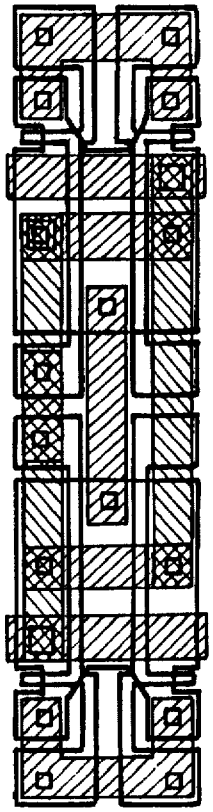
FIG. 9 is a layout diagram for explaining the second embodiment of the present invention.
Figure 12A:
FIGS. 12(a) to 12(c) are circuit diagrams and a layout diagram for explaining a related art reference 2.
Figure 12B:
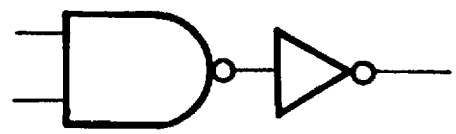
Figure 12C:
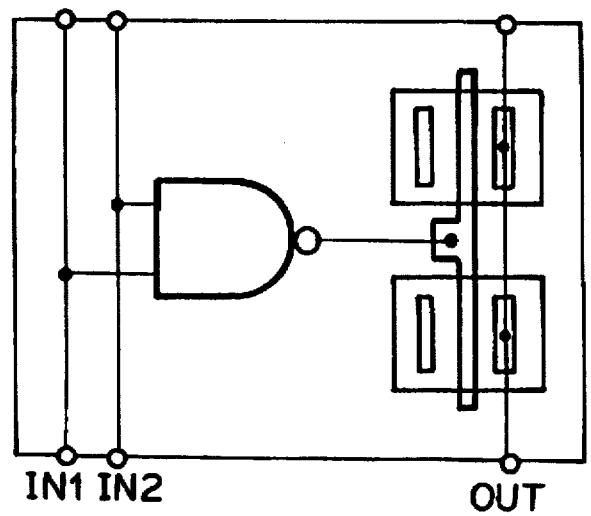
Figure 13:
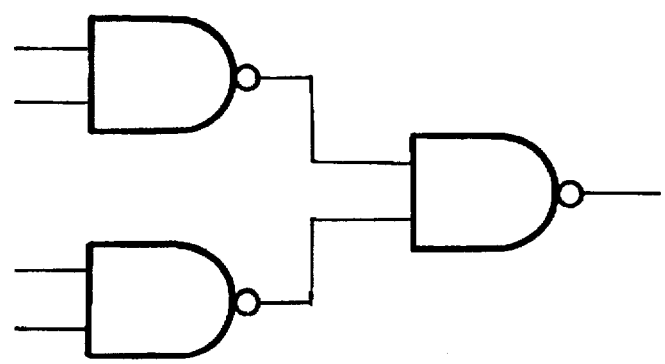
FIG. 13 is a circuit diagram for explaining a related art reference 3.

FIG. 9 is a layout diagram of the buffer circuit shown in FIG. 7(b). In FIG. 9, two transistors are connected in parallel so as to improve the load driving capability. When the resistor device is omitted, the buffer circuit can be structured of one basic cell.

FIG. 10 is a layout diagram for explaining the second embodiment of the present invention. The buffer circuit shown in FIG. 9 is applied for the static latch circuit shown in FIG. 4(c). In FIG. 10, finely hatched patterns represent metal lines on the first layer. Coarsely hatched patterns represent metal wires on the second layer. Small squares 111 represent contacts. Large squares 141 represent throughholes that connect the metal wires on the first layer and the metal wires on the second layer. Reference numeral 232 is a power supply line. Reference numeral 233 is a ground line. Reference numeral 144 is an input terminal position. Reference numeral 145 is an output terminal position. Reference numeral 146 is a C signal input terminal position. Reference numeral 147 is a CI signal input terminal position.

FIG. 11 shows delay time characteristics in the case that the libraries shown in FIGS. 3(a), 3(b), and 3(c) are formed by 0.35 μm CMOS technology. In this case, the power supply voltage is 2.5 V. The load is structured of three fan-outs and wires. The horizontal axis of FIG. 11 represents a wiring length of a load. In FIG. 11, the case (1) represents the characteristics of the circuit shown in FIG. 3(a) of which the channel width of the basic transistor is 10 μm. The case (2) represents the characteristics of the circuit shown in FIG. 3(a) of which the channel width of the basic transistor is 5 μm. The increase of the delay time is not so large at small wiring load condition, and power consumption can be reduced the half of the case (1). The case (3) represents the characteristics of the circuit shown in FIG. 3(c) of which the channel width of the basic transistor is 5 μm. The increase of the delay time is not so large at large wiring load condition, and the power consumption on the preceding stage can be reduced the half of case (1). The case (4) represents the characteristics of which the channel width of the basic transistor is 5 μm and the circuit shown in FIG. 3(a) is structured of a power gate. The delay time and power consumption of the case (4) are almost the same as those of the case (1).

As described above, a library group according to the present invention and a logic circuit structured thereof have plural logic gates and function blocks that have the same logic function and different load driving capability. Thus, by selecting them, a desired performance can be obtained. In addition, since each of the libraries according to the present invention has the same size and the same input/output terminal positions, it is not necessary to rework and modify placement and wiring designs. Moreover, the selection does not adversely affect the other portions. Even if a high end EWS (engineering work station) is used, it takes several days to perform placement and wiring designs and their verification for a gate array for use with a large scale logic LSI (for example, CPU, ASIC, DRAM, and EEPROM). Thus, this effect is very significant. In addition, although the library group according to the present invention is structured of basic cells of basic transistors with a small channel width, when they are properly used, the operating speed that is equivalent to that of basic cells of basic transistors with a large channel width can be accomplished.

Although the present invention has been shown and described with respect to best mode embodiments thereof, it should be understood by those skilled in the art that the foregoing and various other changes, omissions, and additions in the form and detail thereof may be made therein without departing from the spirit and scope of the present invention.

What is claimed is:

1. A library group structured of basic cells and having logic gates which have the same logic function, the same size, and the same input/output terminal positions and which have different load driving capability.

2. The library group as set forth in claim 1, wherein a portion which performs a logic function and a portion which performs a load driving function are structured of the same and independent basic cells.

3. The library group as set forth in claim 1, wherein transistors which have three or less contact positions in source and drain diffusion layer regions are used as the cells.

4. The library group as set forth in claim 2, wherein the portion which performs the load driving function is structured of a lateral type bipolar device corresponding to a silicon-on-insulation (SOI) technology.

5. The library group as set forth in claim 2, wherein the portion which performs the load driving function is structured of a hybrid mode device corresponding to a silicon-on-insulation (SOI) technology.

6. A semiconductor integrated circuit structured of the library group as set forth in claim 1.

7. A library group structured of basic cells and having function blocks which have the same logic function, the same size, and the same input/output terminal positions and which have different load driving capability.

8. The library group as set forth in claim 7, wherein a portion which performs a logic function and a portion which performs a load driving function are structured of the same and independent basic cells.

9. The library group as set forth in claim 7, wherein transistors which have three or less contact in source and drain diffusion layer regions are used as the cells.

10. The library group as set forth in claim 8, wherein the portion which performs the load driving function is structured of a lateral type bipolar device corresponding to a silicon-on-insulation (SOI) technology.

11. The library group as set forth in claim 8, wherein the portion which performs the load driving function is structured of a hybrid mode device corresponding to a silicon-on-insulation (SOI) technology.

12. A semiconductor integrated circuit structured of the library group as set forth in claim 7.

13. A library group structured of basic cells and having logic gates and function blocks which have the same logic function, the same size, and the same input/output terminal positions and which have different load driving capability.

14. The library group as set forth in claim 13, wherein a portion which performs a logic function and a portion which performs a load driving function are structured of the same and independent basic cells.

15. The library group as set forth in claim 13, wherein transistors which have three or less contact positions in source and drain diffusion layer regions are used as the basic cells.

16. The library group as set forth in claim 14, wherein the portion which performs the load driving function is structured of a lateral type bipolar device corresponding to a silicon-on-insulation (SOI) technology.

17. The library group as set forth in claim 14, wherein the portion which performs the load driving function is structured of a hybrid mode device corresponding to a silicon-on-insulation (SOI) technology.

18. A semiconductor integrated circuit structured of the library group as set forth in claim 13.

19. A logic circuit for use with an integrated circuit structured of a library group structured of basic cells and having logic gates which have the same logic function, the same size, and the same input/output terminal positions and which have different load driving capability.

20. A logic circuit for use with an integrated circuit structured of a library group structured of basic cells and having function blocks which have the same logic function, the same size, and the same input/output terminal positions and which have different load driving capability.

21. A logic circuit for use with an integrated circuit structured of a library group structured of basic cells and having logic gates and function blocks which have the same logic function, the same size, and the same input/output terminal positions and which have different load driving capability.

22. The logic circuit as set forth in claim 21, wherein a portion which performs a logic function and a portion which performs a load driving function are structured of the same and independent basic cells.

23. A semiconductor integrated circuit produced by method for producing an integrated circuit structured of a library group structured of basic cells and having logic gates which have the same logic function, the same size, and the same input/output terminal positions and which have different load driving capability.

* * * * *